(12) United States Patent
Hartmann et al.

(10) Patent No.: US 6,782,060 B2
(45) Date of Patent: Aug. 24, 2004

(54) METHOD AND APPARATUS FOR GENERATING RELIABILITY INFORMATION FOR CHANNEL DECODING IN A RADIO RECEIVER

(75) Inventors: Ralf Hartmann, Munich (DE); Peter Bohnhoff, Munich (DE)

(73) Assignee: Infineon Technologies AG, Munich (DE)

( * ) Notice: Subject to any disclaimer, the term of this patent is extended or adjusted under 35 U.S.C. 154(b) by 52 days.

(21) Appl. No.: 10/052,125

(22) Filed: Jan. 17, 2002

(65) Prior Publication Data

US 2002/0150175 A1 Oct. 17, 2002

Related U.S. Application Data

(63) Continuation of application No. PCT/DE00/02468, filed on Jul. 27, 2000.

(30) Foreign Application Priority Data

Jul. 29, 1999 (DE) .......................................... 199 35 824

(51) Int. Cl.[7] .............................................. H03D 1/00
(52) U.S. Cl. ..................................................... 375/341
(58) Field of Search ................................. 375/341, 316, 375/350, 229, 343; 714/794, 795; 708/422, 426

(56) References Cited

U.S. PATENT DOCUMENTS

| | | | |
|---|---|---|---|
| 5,119,400 A | 6/1992 | Koch | |
| 5,307,374 A | 4/1994 | Baier | |
| 6,302,576 B1 | * 10/2001 | Ono et al. | .................. 714/794 |

FOREIGN PATENT DOCUMENTS

| | | |
|---|---|---|
| DE | 39 11 999 A1 | 4/1989 |
| DE | 40 38 251 A1 | 11/1990 |
| DE | 44 27 831 C2 | 2/1996 |
| EP | 0 843 444 A2 | 11/1997 |
| EP | 1 065 851 A1 | 7/1999 |

OTHER PUBLICATIONS

Hagenauer, Joachim, et al.; "A Viterbi Algorithm with Soft–Decision Outputs and its Applications;" IEEE Nov. 27–30, 1989, vol. 3, pp. 1680–1686.

Koch, Wolfgang, et al.; "Optimum and Sub–Optimum Detection of Coded Data Disturbed by Time–Varying Intersymbol Interference;" IEEE Dec. 2–5, 1990, vol. 3, pp. 1679–1684.

Eyuboğlu, M. Vedat, et al.; "Reduced–State Sequence Estimation with Set Partitioning and Decision Feedback;" IEEE Jan. 1988, vol. 36, No. 1. pp. 13–19.

Müller, Stefan H., et al.; "Reduced–State Soft–Output Trellis–Equalization Incorporating Soft Feedback;" IEEE May 1996, pp. 95–100.

* cited by examiner

Primary Examiner—Khai Tran
(74) Attorney, Agent, or Firm—Marshall, Gerstein & Borun LLP

(57) ABSTRACT

An equalizer of a radio receiver for generating reliability information (q) that specifies probabilities of a received data symbol (z) being based on a particular transmitted value. The reliability information (q) is determined for each received data symbol (z) by evaluating trellis state transitions through use of a particular metric, both trellis-based symbols and decision-feedback symbols being evaluated. The decision-feedback symbols used are state-independent symbols that have previously been decided by means of a hard decision.

15 Claims, 2 Drawing Sheets

METHOD AND APPARATUS FOR GENERATING RELIABILITY INFORMATION FOR CHANNEL DECODING IN A RADIO RECEIVER

RELATED APPLICATIONS

This continuing patent application claims priority under 35 U.S.C. §120 from International Application Serial No. PCT/DE00/02468, which was filed on Jul. 27, 2000.

BACKGROUND OF THE INVENTION

The present invention relates to a method for generating reliability information for a channel decoder of a radio receiver, particularly a mobile radio receiver, and to a corresponding radio receiver.

Transmission channels in mobile radio systems are characterized by their time-dependent multipath reception, which leads to intersymbol interference in the case of digital transmission systems. In order to be able to control such intersymbol interference, equalization of the received data is required at the receiving end. At the transmitting end, the data to be transmitted are transmitted interleaved and channel-coded due to the rapidly changing transmission conditions and for suppressing adjacent-channel and co-channel interference.

For the channel decoding at the receiving end, it is desirable to have information that specifies the reliability of the equalization performed by the equalizer. This reliability information is information that is obtained by a so-called soft decision. In contrast to a hard decision in which only a fixed decision threshold is used, a multiplicity of decision thresholds is used in the case of a soft decision, which distinctly increases the reliability of the decision. Equalizers as used, for example, in GSM receivers and also provided in accordance with the future expansion of the GSM mobile radio standard, EDGE, therefore must adequately equalize the received signal on the one hand, and, on the other hand, provide the aforementioned reliability information.

Many different methods for generating the aforementioned reliability information are known and in mobile radio systems, algorithms are frequently used which are based on a so-called Maximum Likelihood Sequence Estimation (MLSE) described, for example, in "Digital Communications", Proakis, J. G., McGraw-Hill, New York, 1983. The most widely used implementation of this method is the Viterbi algorithm with which the aforementioned reliability information is obtained with the aid of trellis diagrams, in the form of probabilities of whether a received symbol is based on a transmitted '0' or a transmitted '1'.

However, since this (optimum) algorithm is very complex and, as a result, very computationally intensive, and requires very large storage space, various sub-optimal methods have been developed that provide reliability information for the channel decoder in a simpler manner.

Such a sub-optimal method is described, among other things, in "Optimum and Sub-optimum Detection of Coded Data Disturbed by Time-Varying Intersymbol Interference", Wolfgang Koch and Alfred Baier, 1990 IEEE. According to this method called "Reduced State Soft Decision Equalizer", the reliability information is generated symbol by symbol in the equalizer. The corresponding algorithm is very similar to a hard decision Viterbi algorithm but it generates the reliability information in a distinctly simpler manner, the reliability information for a received symbol at time $\mu-L$ being determined at a time $\mu$. L here designates the length of the observation period and corresponds to at least the length of the channel impulse response of the transmission channel. The reliability information is determined by determining the best "one path" of the trellis diagram (i.e., the best or most advantageous path having the value '1' at time $\mu-L$) and the best "zero path" (i.e., the best or most advantageous path having the value '1' at time $\mu-L$) by means of a trellis diagram. These two paths of the trellis diagram are determined by means of metrics that are calculated for the individual state transitions in the trellis diagram. In this method, in particular, the so-called "matched-filter" metric is used. Finally, the reliability information is obtained by putting the metrics calculated for the best "one path" and best "zero path" in this manner in relation to one another. To reduce the computational expenditure and the storage requirement, a trellis having a reduced number of states is used for calculating the individual metrics. A trellis-based equalization is only started for elements $0 \ldots L'$ ($L'<L$) of the channel impulse response whereas the remaining elements $L'+1 \ldots L$ are only included in the trellis-based equalization in a decision-feedback manner. The principles of this decision feedback (Decision Feedback Sequence Estimation) can be found, for example, in the paper "Reduced-state Sequence Estimation with Set Partitioning and Decision Feedback", Vedat Eyuboglu and Shahid Qureshi, 1988 IEEE.

In the procedure described above, the equalizer must determine the best "one-path" and "zero path" with reference to time $\mu-L'$ at each time $\mu$ and calculate from these determinations the reliability information for the received symbol at time $\mu-L'$. In this process, the branch metrics include bits at times $\mu \ldots \mu-L'$ and bits at times $\mu-L'-1 \ldots \mu-L$, the latter bits, as already described, being included in the metrics calculation as decision feedback. These latter bits are obtained from the individual so-called "survivor" paths of the $2^{L'}$ states of the trellis diagram (i.e., the most inexpensive and most probable state transitions in each case), which, however, are different from state to state as a consequence, so that a correspondingly high computational effort and storage requirement is needed since the equalizer must carry a list with $2^{L'}$ states at each time $\mu$.

SUMMARY OF THE INVENTION

The presently disclosed method and apparatus provide generation of information for channel decoding in a radio receiver wherein the computational expenditure and the storage space needed for computations are reduced.

Specifically, a method for generating reliability information for channel decoding in a radio receiver is disclosed wherein reliability information (q) specifies probabilities of a data symbol (z) received by the radio receiver via a radio channel based on one of first and second values that are transmitted. The method includes determining reliability information (q) for a time $\mu-L'$ at an arbitrary time $\mu$ for each received data symbol (z) by determining through the use of a state model having $2^{L'}$ states a first path that most probably contains the first value at time $\mu-L'$. Also a second path which most probably contains a second value at time $\mu-L'$ is determined and metrics calculated for the first path and the second path are placed into a relationship with one another wherein metrics calculated for the first path and the second path are calculated in dependence on a first group of symbols of the state model present at time $\mu \ldots \mu-L'$ and a second group of symbols of the state model present at times $\mu-L'-1 \ldots \mu-L$ and L corresponding to at least the length of a channel impulse response of the radio channel with L greater than L'. Furthermore, the method includes the step of utilizing a value that has been decided before the time $\mu$–L' and is identical for all states of the state model as symbols of the second group for determining the reliability information (q) for time $\mu$–L'.

An apparatus for use in a radio receiver is also disclosed that includes an equalizer configured to equalize a radio signal received via a radio channel and generate reliability information (q) for a downstream channel decoder, wherein the reliability information (q) specifies probabilities of a received data symbol (z) based on at least one of a first and second transmitted value. The equalizer also determines for each received data symbol (z) at an arbitrary time $\mu$ a reliability information item (q) for a time $\mu$–L' by determining, by means of a state model with $2^{L'}$ states, a first path that most probably contains the first value at time $\mu$–L' and a second path that most probably contains the second value at time $\mu$–L'. The equalizer further places metrics calculated for the first path and the second path in relationship with one another. Additionally, the equalizer calculates the metrics calculated for the first path and the second path in dependence on a first group of symbols of the state model present at times $\mu$ ... $\mu$–L' and a second group of symbols of a state model present at times $\mu$–L'–1 ... $\mu$–L, with L corresponding to at least the length of the channel impulse response and the radio channel with L greater than L'. Finally, the equalizer is also configured to utilize the value of the reliability information that was decided before time $\mu$–L' and is identical for all states of the state model as symbols of the second group in order to determine the reliability information (q) for the time $\mu$–L' symbols.

DETAILED DESCRIPTION OF THE PREFERRED EMBODIMENTS

Figure 1:
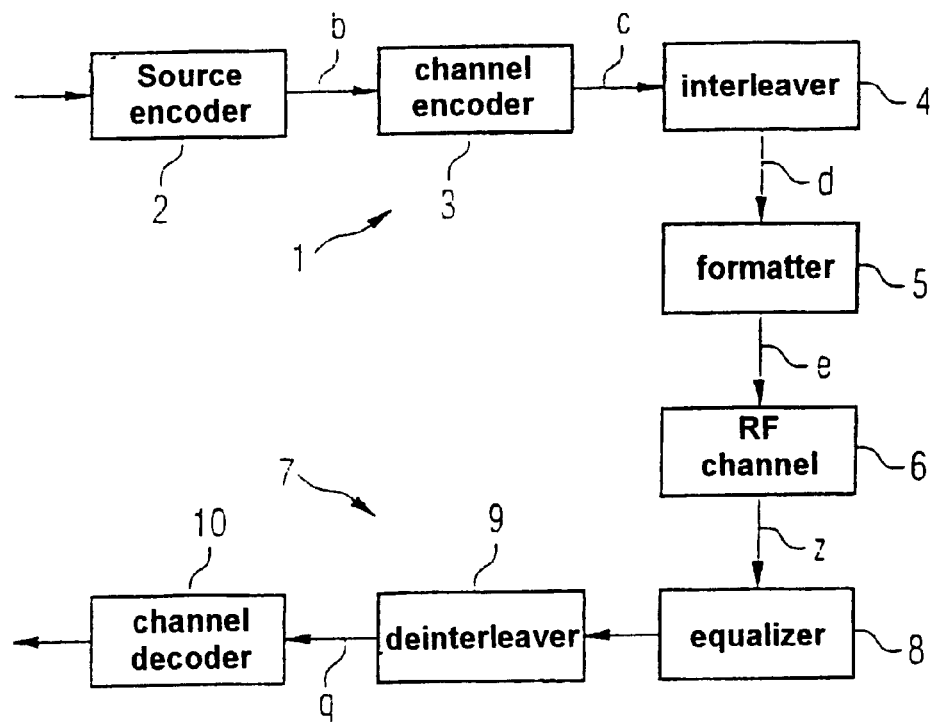
FIG. 1 illustrates a mobile radio transmission model in the form of a simple block diagram.

To derive and explain the principles used in the method and apparatus constructed in accordance with the teachings of the present invention, reference is made in the text that follows to the aforementioned printed document "Optimum and Sub-optimum Detection of Coded Data Disturbed by Time-varying Intersymbol Interference", Wolfgang Koch and Alfred Baier, 1990 IEEE, and, in particular, to the transmission model of a mobile radio system shown in FIG. 1, which includes a mobile radio transmitter 1 and a mobile radio receiver 7 that communicate with one another via a RF channel 6.

In the transmitter 1, information to be transmitted (e.g., voice information) is first converted into a digital signal (i.e., into a sequence of '1' and '0' symbols) by a source encoder 2 and output in the form of source-coded data words or data vectors b, the individual elements or symbols of which in each case have the value '1' or '0'. A channel encoder 3 maps each data word b into a code word c, the symbols of which are permuted (i.e., interleaved by an interleaver 4). Ideally, the interleaving is carried out in such a manner that any two symbols of a code word c are mapped to two different output words d of the interleaver 4. Finally, a formatter 5 adds L known symbols (so-called "tail" symbols) to the beginning and end of each data word d of the interleaver 4 to provide a defined beginning and end state of the model of the channel explained in greater detail in the text to follow. Thus, the formatter 5 outputs transmit words or transmit vectors e, where e=$(e_{1-L}, \ldots, e1, e2, \ldots, e_M)$ and M=I+L, where I is the length of the data words d output by the interleaver 4.

Figure 2:
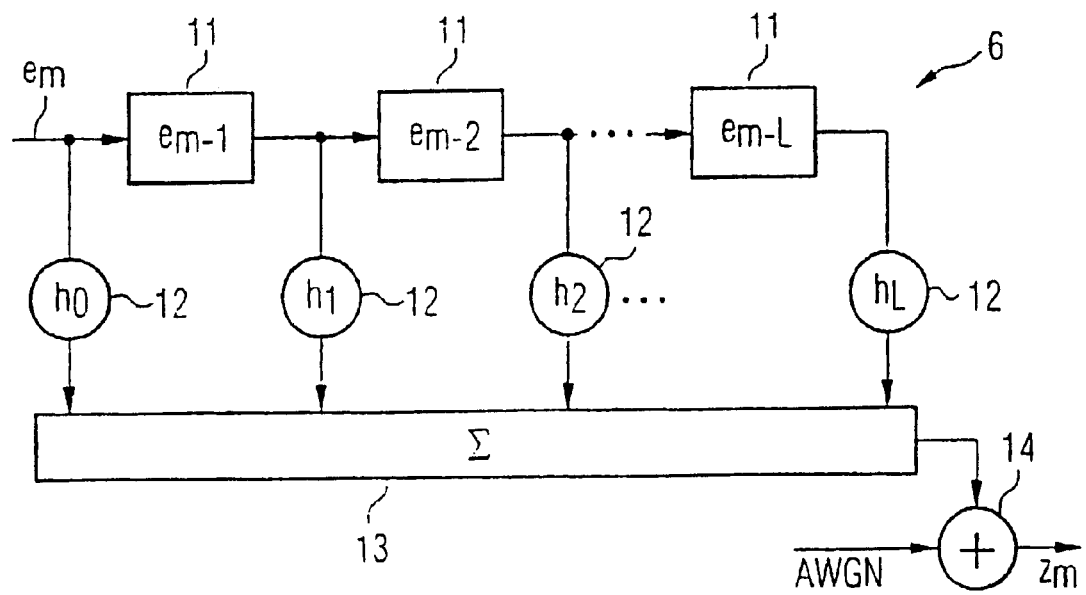
FIG. 2 illustrates a model of the channel of the mobile radio system shown in FIG. 1.

The RF channel 6 shown in FIG. 1 comprises, among other things, a modulator and amplifier of a transmitter (not shown), the actual RF channel (transmission channel) and a receiver input stage (not shown), including an input filter and an A/D converter of the receiver and can be represented by the RF channel model 6 shown in FIG. 2. The channel model corresponds to a state machine having L storage stages, the individual temporarily stored transmit symbols $e_m \ldots e_{m-L}$ of which are added with the aid of an adder 13 via a multiplier 12. The coefficients $h_0 \ldots h_L$ correspond to the coefficients of the channel impulse response. The model also takes account of the noise occurring in the transmission channel in the form of the additive white Gaussian noise (AWGN) which is superimposed on the output signal of the adder 13 with the aid of an adder 14 so that, finally, a received symbol $z_m$ of the receiver is obtained.

Turning back to FIG. 1, receiver 7, equalizer 8, deinterleaver 9 and channel decoder 10 jointly have the task of determining the original transmit sequence b with the greatest possible reliability z by means of the received sequence z. For this purpose, reliability information is generated with the aid of a soft decision for the channel decoder 10, the reliability information specifying for each received symbol the a priori probability that the received symbol is based on a transmitted '0' or '1'.

To generate this reliability information, the channel model shown in FIG. 2 may be represented by a corresponding trellis diagram that describes the behavior of the channel in the form of state transitions. In this arrangement, the trellis specifies for each instantaneous state of the channel a new state in dependence on a new symbol $e_m$, a trellis state at time $\mu$ being designated by $S_\mu$ and being defined by $S_\mu=(e_{\mu-L+1}, \ldots, e_\mu)$, as will be explained in the text that follows.

Each change of state $S_{\mu-1} \to S_\mu$ can be assigned a metric increment which is then evaluated later for assessing the probability of this change in state and is defined by the following formula:

$$\lambda(S_{\mu-1}, S_\mu) = \left| z_\mu - \sum_{l=0}^{L} e_{\mu-l} h_l \right|^2 \div \sigma^2 \qquad (1)$$

Alternatively, the following so-called "matched-filter" metric as described in "Digital Communications", Proakis, J. G., McGraw-Hill, New York, 1983, for example, may also be used:

$$\lambda(S_{\mu-1}, S_\mu) = -\mathrm{Re}\left\{ e_\mu \left( y_\mu - \sum_{l=1}^{L} e_{\mu-l} h_l \right) \right\} \div \sigma^2 \qquad (2)$$

The expression $$y_\mu = \sum_{l=0}^{L} z_{\mu+l} h_l \qquad (3)$$

designates the output value of the matched-filter at time $\mu$ and the expression:

$$\rho_l = \sum_{i=0}^{L-1} h_{i+l} h_i \text{ for } l = 0 \ldots L \tag{4}$$

designates the 1-th sample of the autocorrelation function of the channel impulse response. However, the presently disclosed method and apparatus are not restricted to using the "matched-filter" metric.

Using the metric formula (2) described above, the trellis corresponding to the channel 6 shown in FIG. 2 can now be evaluated in order to calculate corresponding probabilities for each state $S_\mu$ for each trellis or time interval $\mu$. The procedure ideally passes both in the reverse direction and in the forward direction through the trellis. In the text that follows, the algorithm for processing a received word z will be explained in greater detail.

When passing through the trellis in the reverse direction, a reverse metric $\Lambda_b(S_\mu)$ can be calculated for each trellis step $\mu$ from $\mu=M$ to $\mu=L$ and for each trellis state $S_\mu$, using the following recursion:

$$\Lambda_b(S_{\mu-1}) = -\ln\{\exp(-\Lambda_b(S'_\mu) - \lambda(S_{\mu-1}, S'_\mu)) + \exp(-\Lambda_b(S''_\mu) - \lambda(S_{\mu-1}, S''_\mu))\} \tag{5}$$

The two states $S'_\mu$ and $S''_\mu$ are defined by the state $S_{\mu-1}$ in the presence of state value $e_\mu=1$ or $e_\mu=0$ respectively.

Analogously, a forward metric $\Lambda_f(S_\mu)$ can be calculated for each trellis state $S_\mu$ using the following recursion:

$$\Lambda_f(S_\mu) = -\ln\{\exp(-\Lambda_f(S'_{\mu-1}) - \lambda(S'_{\mu-1}, S_\mu)) + \exp(-\Lambda_f(S''_{\mu-1}) - \lambda(S''_{\mu-1}, S_\mu))\} \tag{6}$$

In this case, the two states $S'_{\mu-1}$ and $S''_{\mu-1}$ are defined by the state $S_\mu$ in the presence of the state value $e_{\mu-L}=1$ or $e_{\mu-L}=0$ respectively.

For each state transition $S_{\mu-1} \to S_\mu$ of the trellis, the metrics $\Lambda_f(S_{\mu-1})$, $\lambda(S_{\mu-1}, S_\mu)$ and $\Lambda_b(S_\mu)$ can now be added and their inverse exponentials can be added together separately for $e_{\mu-L}=0$ and $e_{\mu-L}=1$ over all states $S_\mu$:

$$u(e_{\mu-L}) = -\ln\left\{\sum_{S_\mu} \exp(-\Lambda_f(S_{\mu-1}) - \lambda(S_{\mu-1}, S_\mu) - \Lambda_b(S_\mu))\right\} \tag{7}$$

Using the expression shown in formula (7), finally, a soft decision value $q(e_{\mu-L})$ can be calculated for bit $e_{\mu-L}$ at time $\mu$ by putting the values calculated for $e_{\mu-L}=1$ and $e_{\mu-L}=0$ by means of the formula (7) in relation to one another:

$$q(e_{\mu-L}) = u(e_{\mu-L}=1) - u(e_{\mu-L}=0) \tag{8}$$

Figure 3A:
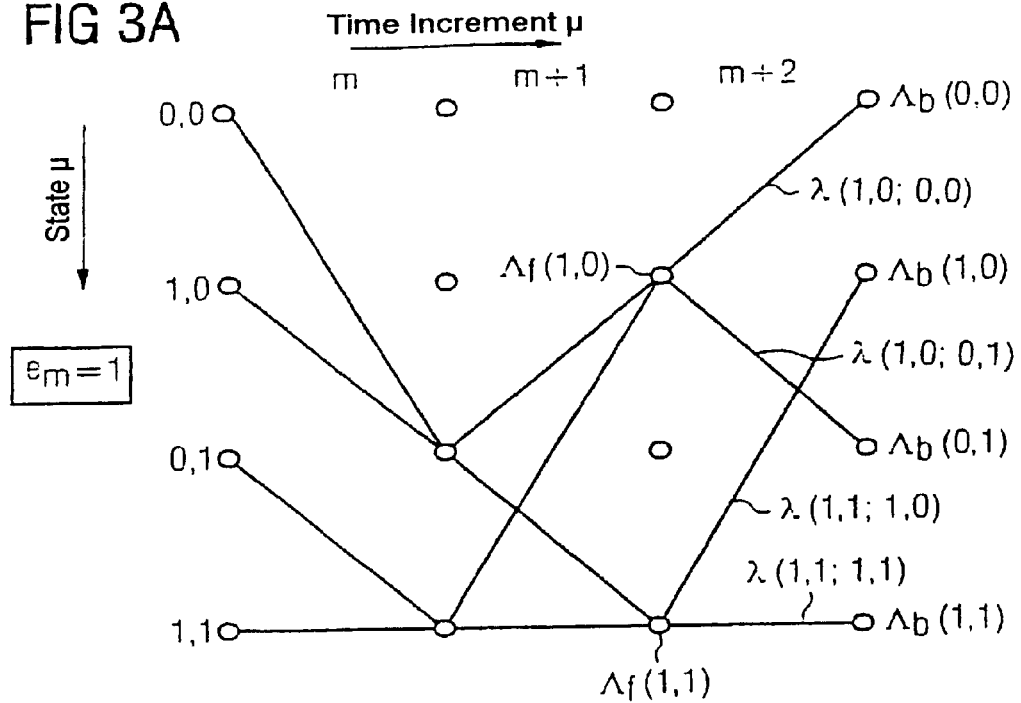
FIGS. 3A and 3B illustrate representations for explaining the calculation of metrics in a trellis diagram.
Figure 3B:
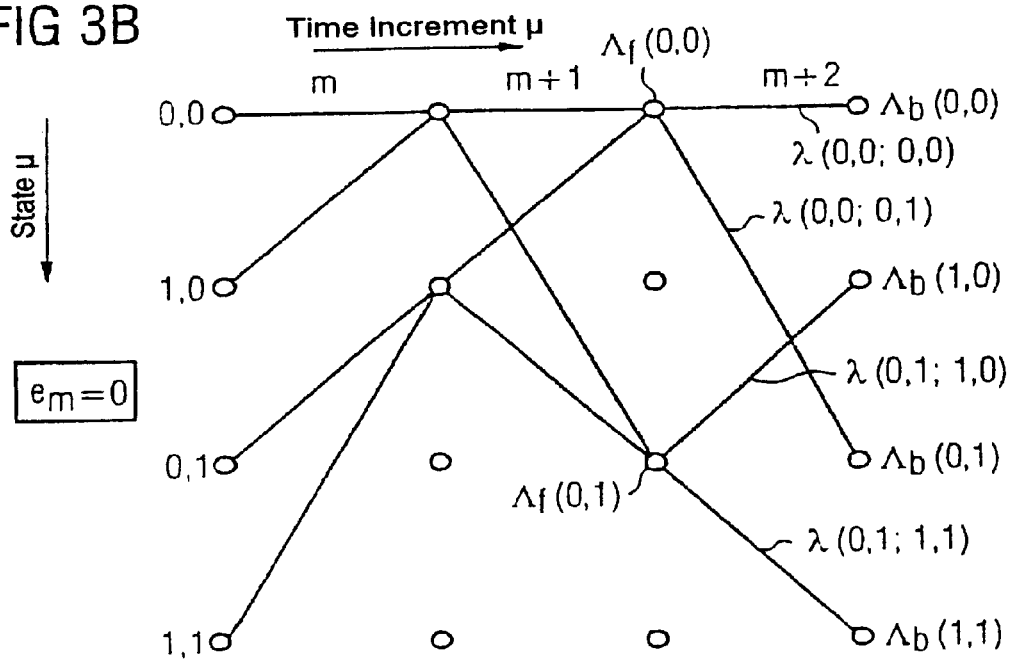

To clarify the above formula (7), a section of the trellis for L=2 and $e_m=1$, associated with the channel model shown in FIG. 2, is shown in FIG. 3A and a section of the same trellis for $e_m=0$ is shown in FIG. 3B. Both in FIG. 3A and in FIG. 3B, only those paths of the trellis are shown that contribute to the sum of the formula (7) in this example. Furthermore, the metrics $\Lambda_{f(S\mu-1)}$, $\lambda(S_{\mu-1}, S_\mu)$ and $\Lambda_b(S_\mu)$ are in each case entered in FIGS. 3A and 3B.

Since optimum soft decision values can be obtained as reliability information for the channel decoding with the aid of the procedure described above, this algorithm is called "optimum soft decision equalization algorithm" (OSDE), in "Optimum and Sub-Optimum Detection of Coded Data Disturbed by Time-varying Intersymbol Interference", Wolfgang Koch and Alfred Baier, 1990 IEEE.

Since, however, this algorithm requires a lot of storage space and great computational effort, there is a need for a simplified algorithm, the complexity of which, on the one hand, is distinctly reduced, and which, on the other hand, still supplies the most accurate reliability information possible.

With respect to this, it is first proposed in "Optimum and Sub-Optimum Detection of Coded Data Disturbed by Time-varying Intersymbol Interference", Wolfgang Koch and Alfred Baier, 1990 IEEE, to simplify the exponential calculations in the formula (7). Formula (7) generally contains an expression of the form $-\ln(e^{-x} + e^{-y})$, the following relation holding true, however, for such expressions:

$$-\ln(e^{-x} + e^{-y}) = \min(x, y) - \ln(1 + e^{-|y-x|}) \tag{9}$$

For $x \ll y$ and $x \gg y$, the expression $-\ln(e^{-x} + e^{-y})$ can thus be approximated with negligible error by forming the minimal value $\min(x, y)$. A further simplification can be achieved if passing through the trellis in the reverse direction is omitted and the metrics $\Lambda_b(S_\mu)$ in the formula (7) are thus set to 0 for all states $S_\mu$.

The calculation of the reliability information at time $\mu$ for the time $\mu-L$ according to formula (8) is thus simplified as follows:

$$q(e_{\mu-L}) = \min_{S_\mu | e_{\mu-L}=1} (\Lambda_f(S_{\mu-1}) + \lambda(S_{\mu-1}, S_\mu)) - \min_{S_\mu | e_{\mu-L}=0} (\Lambda_f(S_{\mu-1}) + \lambda(S_{\mu-1}, S_\mu)) \tag{10}$$

The essential difference from the traditional Viterbi algorithm thus merely consists in that only the selection of two minimum values from a set of $2^L$ metrics is required for calculating the soft decision values $q(e_{\mu-L})$. In "Optimum and Sub-optimum Detection of Coded Data Disturbed by Time-Varying Intersymbol Interference", Wolfgang Koch and Alfred Baier, 1990 IEEE, this algorithm is therefore called "Soft Decision Viterbi Equalizer" (SDVE).

A further simplification can be achieved if this SDVE algorithm with $2^L$ states is replaced by an SDVE algorithm with a reduced number of states $2^{L'}$ of the trellis with $L'<L$. The following expression is then obtained for the above formula (2) for calculating the matched-filter metrics:

$$\lambda'(S_{\mu-1}, S_\mu) = -\text{Re}\left\{e_\mu\left(y_\mu - \sum_{l=1}^{L'} e_{\mu-l} \rho_l - \sum_{l=L'+1}^{L} e'_{\mu-l} \rho_l\right)\right\} \div \sigma^2 \tag{11}$$

Bits $e_{\mu-1}$ for $l=1 \ldots L'$ then represent the state bits of the state $S_{\mu-1}$ as in the above algorithm. In addition, the calculation of the matched-filter metrics is now also dependent on a second group of bits $e'_{\mu-1}$ for $l=L'+1 \ldots L$ that are not directly included in the trellis-based equalization, but instead, are decision feedback bits.

Whereas "Optimum and Sub-optimum Detection of Coded Data Disturbed by Time-Varying Intersymbol Interference", Wolfgang Koch and Alfred Baier, 1990 IEEE, proposes with respect to this group of decision feedback bits to determine bits $e'_{\mu-1}$ for $l=L'+1 \ldots L$ by means of the so-called "survivor" paths for the $2^{L'}$ states of the trellis (compare the above description), it is proposed in the present method and apparatus not to use any state-dependent bits for this and, instead, use bits decided previously (i.e., symbols, the value of which has previously been defined as '0' or '1') that have the same value for all $2^{L'}$ states.

These decision feedback bits $e'_{\mu-1}$ for $l=L'+1 \ldots L$ can be obtained by determining a reliability information item for the symbol at time $\mu-L'$ from the best zero path and the best one path as normal at every time $\mu$. This reliability information is converted into a bit having the value 0 or 1 by means of a fixed decision threshold (i.e., with the aid of a hard decision) and used as decision feedback bit for the further L–L' times. Bits $e'_{\mu-L'-1} \ldots e'_{\mu-L}$ are thus constant for all $2^{L'}$ states as a result of which less storage space and computational effort is required for calculating the matched-filter metrics according to formula (10). The above formulae do not need to be modified for carrying out the disclosed method and apparatus.

The soft decision reliability information $q(e_{\mu-L'})$ can then be calculated analogously to the above formula (10) if the expression of formula (11) is inserted into the formula (10):

$$q(e_{\mu-L'}) = \min_{S_\mu | e_{\mu-L'}=1} (\Lambda_f(S_{\mu-1}) + \lambda'(S_{\mu-1}, S_\mu)) - \min_{S_\mu | e_{\mu-L'}=0} (\Lambda_f(S_{\mu-1}) + '(S_{\mu-1}, S_\mu)) \quad (12)$$

At every time $\mu$, a reliability information item is, therefore, calculated for time $\mu-L'$ by using a reduced number of $2^{L'}$ different states. The disclosed method and apparatus are, thus, suboptimal approaches of an SDVE algorithm with a reduced number of states.

As discussed, the present disclosure is based on the procedure described in "Optimum and Sub-optimum Detection of Coded Data Disturbed by Time-varying Intersymbol Interference", Wolfgang Koch and Alfred Baier, 1990 IEEE and explained above. According to the method and apparatus constructed in accordance with the teachings of the present invention, however, the bits taken into consideration in the form of a decision feedback are no longer carried in a state-dependent manner in a list but for the decision feedback, symbols are included in the calculation that have already been decided before (i.e., these bits or symbols are identical for all $2^{L'}$ states).

To decide these symbols (i.e., to determine the binary value of these symbols, for example) a reliability information is generated for the symbol at time $\mu-L'$ from the best zero and one path at every time $\mu$, converted into a bit having the corresponding value with the aid of a hard decision and used further in the calculation of the individual metrics during the next L–L' subsequent times.

The disclosed method and apparatus, which, in particular, can be used for equalizing intersymbol interference in mobile radio systems according to the GSM, DCS1800 or PCAS1900 standard, have the great advantage that the implementation effort can be distinctly reduced, both in a hardware implementation and in an implementation on a digital signal processor. This is due to the fact that no elaborate fields need to be carried for the decision feedback bits, but only L–L' variables are sufficient, needing only to be updated once per symbol output so that both storage space and computing power, and thus electrical power, can be saved. In addition, extensive simulation (which has been carried out, for example, for L'=2 on a GSM downlink) has proven that no noticeable deterioration in the bit error rate can be found for the channel models specified in the so-called GSM Recommendation 05.

The foregoing description has been presented for the purposes of illustration and description. It is not intended to be exhaustive or to limit the teachings of the invention to the exemplary embodiments disclosed. Many modifications and variations are possible in light of the above teachings and it is intended that the scope of this patent be limited not by this detailed description, but rather by the claims appended hereto, either literally or under the doctrine of equivalents.

What is claimed is:

1. A method for generating reliability information (q) for channel decoding in a radio receiver, the reliability information (q) specifying, for a time $\mu-L'$ at an arbitrary time $\mu$ for each data symbol (z) received by the radio receiver via a radio channel, the probability that the received data symbol (z) is one of a first and a second value based on one of a first and a second transmitted value, the method comprising:

determining a first path that most probably contains the first value at time $\mu-L'$ and a second path that most probably contains the second value at time $\mu-L'$ according to a state model having $2^{L'}$ states;

calculating metrics for the first path and the second path in dependence on a first group of symbols of the state model present at times $\mu \ldots \mu-L'$ and a second group of symbols of the state model present at times $\mu-L'-1 \ldots \mu-L$, L corresponding to at least a length of a channel impulse response of the radio channel with L>L', symbols of the second group comprising values that have been decided before the time $\mu-L'$ and are identical for all states of the state model; and placing the metrics calculated for the first path and the second path into a relationship with one another.

2. The method according to claim 1, further comprising converting reliability information (q) determined for time $\mu$ into a corresponding binary symbol for the time $\mu-L'$, said binary symbol included in the second group of symbols during subsequent L–L' times.

3. The method according to claim 2, wherein converting the reliability information (q) determined at time $\mu$ comprises using a hard decision for the time $\mu-L'$.

4. The method according to claim 4, wherein the state model comprises a trellis representation.

5. The method according to claim 1, wherein the metrics comprise matched-filter metrics.

6. The method according to claim 5, further comprising calculating a metric $\lambda'$ for a transition from a state $S_{\mu-1}$ to a state $S_\mu$ in the state model at time $\mu$ in accordance with the following formula:

$$\lambda'(S_{\mu-1}, S_\mu) = -\text{Re}\left\{e_\mu\left(y_\mu - \sum_{l=1}^{L'} e_{\mu-l}\rho_l - \sum_{l=L'+1}^{L} e'_{\mu-l}\rho_l\right)\right\} \div \sigma^2$$

where $e_\mu$ designates symbols of the first group of symbols at time $\mu$, $e'_\mu$ designates symbols of the second group of symbols at time $\mu$, $y_\mu$ designates the output symbol of the matched-filter used at time $\mu$, $\sigma^2$ designates the variance of the noise power density of the radio channel and $\rho_1$ designates the lth value of the autocorrelation function of the channel impulse response of the radio channel.

7. The method according to claim 1, wherein the method is used in a mobile radio receiver of a mobile radio system.

8. The method according to claim 7, wherein the method is used in a GSM mobile radio receiver.

9. A radio receiver comprising:

an equalizer to generate reliability information (q), the reliability information (q) specifying, for a time $\mu-L'$ at an arbitrary time $\mu$ for each data symbol (z) received by the radio receiver via a radio channel, the probability that the received data symbol (z) is one of a first and a second value based on one of a first and a second transmitted value, the equalizer configured to:

(a) determine a first path that most probably contains the first value at time $\mu-L'$ and a second path that most probably contains the second value at time $\mu-L'$ according to a state model having $2^{L'}$ states;

(b) calculate metrics for the first path and the second path in dependence on a first group of symbols of the state model present at times $\mu \ldots \mu-L$, L and a second group of symbols of the state model present at times $\mu-L'-1 \ldots \mu-L$, L corresponding to at least a length of a channel impulse response of the radio channel with L>L', symbols of the second group comprising values that have been decided before the time $\mu-L'$ and are identical for all states of the state model; and (c) place the metrics calculated for the first path and the second path into a relationship with one another; and a channel decoder operatively coupled to the equalizer and configured to:
 (a) receive the reliability information (q) from the equalizer, and
 (b) determine whether a received symbol is the first or the second value according to the reliability information (q) received from the equalizer.

10. The radio receiver according to claim 9, the equalizer configured to convert reliability information (q) determined at time $\mu$ into a corresponding binary symbol for the time $\mu-L'$, said binary symbol included in the second group of symbols during subsequent L-L' times.

11. The radio receiver according to claim 10, the equalizer configured to use a hard decision for the time $\mu-L'$ to convert the reliability information (q) determined at time $\mu$ comprises.

12. The radio receiver according to claim 9, wherein the state model comprises a trellis representation.

13. The radio receiver according to claim 9, wherein the metrics comprise matched-filter metrics.

14. The radio receiver according to claim 13, wherein the equalizer is configured to calculate a metric $\lambda'$ for a transition from a state $S_{\mu-1}$ to a state $S_\mu$ in the state model at time $\mu$ in accordance with the following formula:

$$\lambda'(S_{\mu-1}, S_\mu) = -\mathrm{Re}\left\{e_\mu\left(y_\mu - \sum_{l=1}^{L'} e_{\mu-l}\rho_l - \sum_{l=L'+1}^{L} e'_{\mu-l}\rho_l\right)\right\} \div \sigma^2$$

where $e_\mu$ designated the first group of symbols at time $\mu$, $e'_\mu$ designates the second group of symbols at time $\mu$, $Y_\mu$ designates the output symbol of the matched-filter used at time $\mu$, $\sigma^2$ designates the variance of the noise power density of the radio channel and $P_l$ designates the lth value of the autocorrelation function of the channel impulse response of the radio channel.

15. The radio receiver according to claim 9, wherein the radio receiver is a mobile radio receiver of a mobile radio system.

* * * * *

UNITED STATES PATENT AND TRADEMARK OFFICE
CERTIFICATE OF CORRECTION

PATENT NO. : 6,782,060 B2
DATED : August 24, 2004
INVENTOR(S) : Ralf Hartman et al.

It is certified that error appears in the above-identified patent and that said Letters Patent is hereby corrected as shown below:

Column 8,
Line 33, cancel "4" and insert -- 1 --.
Line 38, cancel "$S_{\mu=1}$" and insert -- $S_{\mu-1}$ --.

Column 9,
Line 5, cancel "$\mu$-L, L" and insert -- $\mu$-L' --.

Column 10,
Line 17, cancel "Y" and insert -- $y$ --.
Line 20, cancel "P" and insert -- $\rho$ --.

Signed and Sealed this

Eleventh Day of January, 2005

JON W. DUDAS
*Director of the United States Patent and Trademark Office*